(12) United States Patent
Hayduk et al.

(10) Patent No.: US 6,326,910 B1
(45) Date of Patent: Dec. 4, 2001

(54) PHOTONIC ANALOG-TO-DIGITAL CONVERSION USING LIGHT ABSORBERS

(75) Inventors: Michael J. Hayduk, Clinton; Rebecca J. Bussjager, Utica; Mark A. Getbehead, Rome; Paul M. Payson, Lee Center, all of NY (US); James P. Theimer, Beaver Creek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/707,155

(22) Filed: Nov. 6, 2000

(51) Int. Cl.[7] .............................. H03M 1/00; H03M 1/12
(52) U.S. Cl. ........................................... 341/137; 341/155
(58) Field of Search ........................ 341/137, 155, 341/131; 369/47.33; 359/237, 115, 168

(56) References Cited

U.S. PATENT DOCUMENTS 6,100,831 * 8/2000 Frankel ................................ 341/137
6,118,396 * 9/2000 Song .................................... 341/137
6,188,342 * 2/2001 Gallo ................................... 341/137

* cited by examiner

*Primary Examiner*—Patrick Wamsley
(74) *Attorney, Agent, or Firm*—Harold L. Burstyn; Joseph A. Mancini (57) ABSTRACT

Apparatus and method for high-speed analog-to-digital conversion employs photonic circuits with variable light-absorption. A coherent light source is clocked to produce a stream of coherent light pulses onto which is modulated an analog signal to be converted to digital form. An optical splitter divides the stream of pulses into a number of streams that is proportional to the resolution sought. A passive photonic quantizer absorbs, to a predetermined degree, the light energy of the incident pulse streams. The output of a fully absorbed pulse does not trigger a comparator. Pulse streams of sufficient intensity pass through the light absorbers, and their output does trigger the comparator. The output state of the comparators may be read into a digital memory to form a digital word that represents the analog signal during any discrete clock interval. Most of the elements of the apparatus can be fabricated on a substrate of photonic semiconducting material.

20 Claims, 6 Drawing Sheets

PHOTONIC ANALOG-TO-DIGITAL CONVERSION USING LIGHT ABSORBERS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to high speed electro-optic analog-to-digital converters, and, more specifically, to such analog-to-digital converters in which the quantization of the analog signal is performed entirely by passive photonic elements. This invention also relates to the field of integrated photonic structures in which such electro-optical analog-to-digital converters may be monolithically fabricated.

Analog-to-digital converters ("ADCs") have traditionally been fabricated using microelectronics. For low-speed (i.e., low-bandwidth) analog signals, microelectronic based ADCs are adequate. A problem arises where the analog signal to be digitized is broadband or where it must be sampled at the carrier's frequency. Under these circumstances, microelectronic ADCs quickly approach the limits of their performance. Furthermore, while the speed and resolution of microelectronic ADCs have evolved over the years, this evolution is slow—e.g., six years of development may yield only one bit of improvement in the resolution of a microelectronic ADC. (Robert H. Walden, "Analog-to-Digital Converter Survey and Analysis", 17 *IEEE Journal on Selected Areas in Communications,* 539–550 (April 1999)). Unfortunately, military radar and electronic warfare systems require more than what the state of the art can provide in microelectronic ADCs.

It is thus desirable to provide faster analog-to-digital conversion at higher resolution. Optical sampling provides a significant improvement in ADC performance. In conventional microelectronic ADCs, conversion speed (interchangeable with bandwidth) must be traded for resolution (the length in bits of the representative digital word). With microelectronics, it is simply not possible to achieve both wide bandwidth and high resolution. Optical ADCs, however, overcome this constraint by rapidly converting broadband analog signals to highly resolved digital representation (i.e., words with many bits).

In an optimal analog-to-digital conversion, i.e., with wide bandwidth and high resolution, most of the conversion takes place on a modulated light signal with a maximum of optical processing. Though the prior art tried this approach, it has failed to make use of the full extent of optical processing. Specifically, the prior art still relegates to microelectronics the quantization step of analog-to-digital conversion. Thus the prior-art optical ADCs are suboptimal.

Both time-division multiplexing (TDM) and wavelength-division multiplexing (WDM) optical ADCs exist in the prior art. They are physically large, complicated branched structures that are very sensitive to optical path length and temperature effects. They require precise timing to reconstitute signals. Most importantly, they require microelectronic ADCs to quantize and digitize the sampled analog signals that emanate from each optical branch. Though they do sample a wide band analog signal by dividing it into a set of discrete optical signals, both TDM and WDM optical ADCs require microelectronic ADCs to complete the analog-to-digital conversion.

U.S. Pat. No. 5,010,346 to Hamilton et al. discloses a mode-locked laser source divided into a plurality of optical signals, each of which is modulated by an analog signal. This plurality of modulated optical signals is detected optically and amplified. Hamilton et al. requires that the modulated optical signal be split as many times as is necessary to ensure that the resultant bandwidth of the "split" signal falls within the speed and resolution capability of the microelectronic quantization portion of the circuit. Accordingly, Hamilton, et al. teaches a microelectronic ADC to quantize and digitize each and every one of the plurality of detected outputs. Thus the apparatus of Hamilton et al. ceases to be optical downstream of the detectors. Therefore the resolution and conversion speed limitations typical of microelectronic ADCs limits the utility of Hamilton et al.'s apparatus for broadband signal applications.

U.S. Statutory Invention Registration USH0000353 to Taylor teaches pairs of optical waveguides on a substrate. A modulator induces either of two possible orthogonal phases that represent the amplitude of the sampled analog signal. Optical phase detectors produce one of two possible least significant bit ("LSB") states (i.e., "1" or "0") that depends on the phase state detected. Taylor teaches how to process LSB representations to form a complete digital word that represents the sampled analog signal. Taylor neither teaches nor suggests a means by which a quantized digital word can be formed without digital processing, and therefore, without slowing the analog-to-digital conversion by the time required for digital processing. Therefore the performance of Taylor's apparatus on broadband signals is inherently extremely limited.

U.S. Pat. No. 4,325,603 to Marom also teaches parallel optical waveguides disposed on a substrate wherein laser light is coupled between optical waveguide pairs. The amount of coupling is proportional to the analog signal applied. Marom teaches further that the length of the coupling region between waveguide pairs can be predetermined. Thus Marom eliminates the need for phase shifting the laser light (and the need for light polarizers to obtain bi-phase light). Marom requires, however, two optical waveguide channels for each single bit state determination (i.e., "1" or "0") and two comparators to determine the relative intensity of the waveguides.

OBJECTS AND SUMMARY OF THE INVENTION

It is therefore an object of the present invention to provide an apparatus that overcomes the prior art's dependency on conventional microelectronic circuits to perform optical analog-to-digital conversion.

It is a further object of the present invention to provide passive quantization with photonic materials that can be selectively altered to absorb different amounts of light.

It is still a further object of the present invention to provide an apparatus where a converted analog signal is digitally represented at the output of a passive photonic quantizer and stored in a digital memory.

It is yet a further object of the present invention to provide an apparatus that determines a digital bit state of "1" or "0" as the result of a single threshold detection of a single pulse of modulated light.

An additional object of the present invention is to provide a light source, an electro-optical modulator, an optical splitter, and the elements of a passive photonic quantizer on a common substrate.

Yet another additional object of the present invention is to provide an apparatus passive photonic quantizer substrates.

Briefly stated, apparatus and method for high-speed analog-to-digital conversion employs photonic circuits with variable light-absorption. A coherent light source is clocked to produce a stream of coherent light pulses onto which is modulated an analog signal to be converted to digital form. An optical splitter divides the stream of pulses into a number of streams that is proportional to the resolution sought. A passive photonic quantizer absorbs, to a predetermined degree, the light energy of the incident pulse streams. The output of a fully absorbed pulse does not trigger a comparator. Pulse streams of sufficient intensity pass through the light absorbers, and their output does trigger the comparator. The output state of the comparators may be read into a digital memory to form a digital word that represents the analog signal during any discrete clock interval. Most of the elements of the apparatus can be fabricated on a substrate of photonic semiconducting material.

A passive photonic quantizer receives the output of each branch of the optical power divided into an equal number of light absorbers. Each absorber exhibits a predetermined absorption, i.e., some light absorbers allow a given light pulse to pass through to a detector, while other light absorbers absorb the pulse so that it is not detected. The present invention thus achieves the requisite quantization for analog-to-digital conversion. Optical delay lines delay pulses that pass through channels with less absorbency compared to pulses that pass through channels with greater absorbency. This optical delay insures that all light pulses represent the same sample of the analog input signal at a particular instant. The output voltage of the optical detectors varies with the intensity of the incident light minus the effect of the absorption channel. The light pulses are effectively quantized at the output of the optical detectors, but they require comparison to a reference voltage in comparators. The output of the comparators forms a digital word that is read directly into a digital memory. The delay lines insure that all comparator outputs represent the same sample point on the input analog signal when they are read into the digital memory.

A greater or lesser degree of quantization can be achieved by increasing or decreasing the number of optical splitter branches and accordingly the number of light absorbers, optical delay lines, threshold detectors, and comparators. A longer or shorter digital word of greater or lesser resolution is thereby formed.

As to the photonic quantizer and the light absorbers, only one light absorber is required to quantize a single bit of the digital word, in contrast to prior-art devices, which require a minimum of two optical waveguides: one for the light pulse, and one to serve as the coupled light path. Alternatively, the prior art uses a pair of optical waveguides and detects the relative phase of the light pulse travelling down each of them. In either prior-art device, only one bit state is determined. In contrast, the present invention determines a bit state from only one light absorber. Nothing in the prior art teaches or suggests this feature of the present invention.

Thus the present invention (1) quantizes an analog signal with half the number of optical structures (channels or waveguides) that the prior art requires; and (2) directly forms a digital representation of the analog signal without having to compare the relative phase or intensity of light between each of a pair of waveguides. Therefore the present invention represents a significant improvement on the prior art.

According to an embodiment of the invention, a photonic analog-to-digital converter, comprises: a source of coherent light; a sampling clock, effective for converting the coherent light into a first stream of coherent light pulses; an electro-optic modulator, effective for receiving as inputs the first stream and an analog signal, the output of the modulator being a second stream of modulated coherent light pulses; an optical splitter, effective for splitting the second stream into a plurality of streams, each of the streams comprising modulated coherent light pulses; a passive photonic quantizer, effective for quantizing the plurality of streams, the quantizer further comprising a plurality of light absorbers; a plurality of optical delay lines, effective for aligning a quantized plurality of streams to a discrete instant at which each member of the plurality of streams was sampled from the analog signal; a plurality of optical detectors, effective for converting the quantized plurality of streams into a plurality of detected voltages; a plurality of comparators for comparing the plurality of detected voltages to a reference voltage, whereby a logical "1" is produced if the detected voltage is at least equal to a reference voltage and a logical "0" is produced if the detected voltage is less than the reference voltage; and a digital device, effective for storing a plurality of logical "1" and logical "0" as a digital word synchronous with the sampling clock.

According to a feature of the invention, a method for digitizing an analog signal, comprises the steps of: generating coherent light; generating a clock waveform; sampling the coherent light with the clock waveform to produce a first stream of coherent light pulses; modulating an input analog signal onto the first stream to produce a second stream of modulated coherent light pulses; splitting the second stream into a plurality of streams, each comprising modulated coherent light pulses; passively quantizing the plurality of streams by absorbing the pulses in a like plurality of light absorbers; adjusting in a predetermined fashion an absorption characteristic of each of the plurality of light absorbers; absorbing the plurality of streams in varying degree, whereby some pulses are passed and other pulses are fully absorbed; aligning a quantized plurality of streams to the same instant relative to the time at which they were sampled from the analog signal; detecting each of the quantized plurality of streams, thereby producing a proportional voltage; comparing, within the period of the clock waveform, the proportional voltage to a reference voltage, thereby producing a logical "1" if the proportional voltage is at least equal to the reference voltage and producing a logical "0" if the proportional voltage is less than the reference voltage; and storing the logical "1" and the logical "0" in a digital device.

According to another feature of the invention, a photonic analog-to-digital converter, comprises: means for generating coherent light; means for generating a clock waveform; means for sampling the coherent light with the clock waveform to produce a first stream of coherent light pulses; means for modulating an input analog signal onto the first stream to produce a second stream of modulated coherent light pulses; means for splitting the second stream into a plurality of streams, each comprising modulated coherent light pulses; means for passively quantizing the plurality of streams by absorbing the pulses in a like plurality of light absorbers; means for adjusting in a predetermined fashion an absorption characteristic of each of the plurality of light absorbers; means for absorbing the plurality of streams in varying degree, whereby some pulses are passed and other pulses are fully absorbed; means for aligning a quantized plurality of streams to the same instant relative to the time at which they were sampled from the analog signal; means for detecting each of the quantized plurality of streams, thereby producing a proportional voltage; means for comparing, within the period of the clock waveform, the proportional voltage to a reference voltage, thereby producing a logical "1" if the proportional voltage is at least equal to the reference voltage and producing a logical "0" if the proportional voltage is less than the reference voltage; and means for storing the logical "1" and the logical "0" in a digital device.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
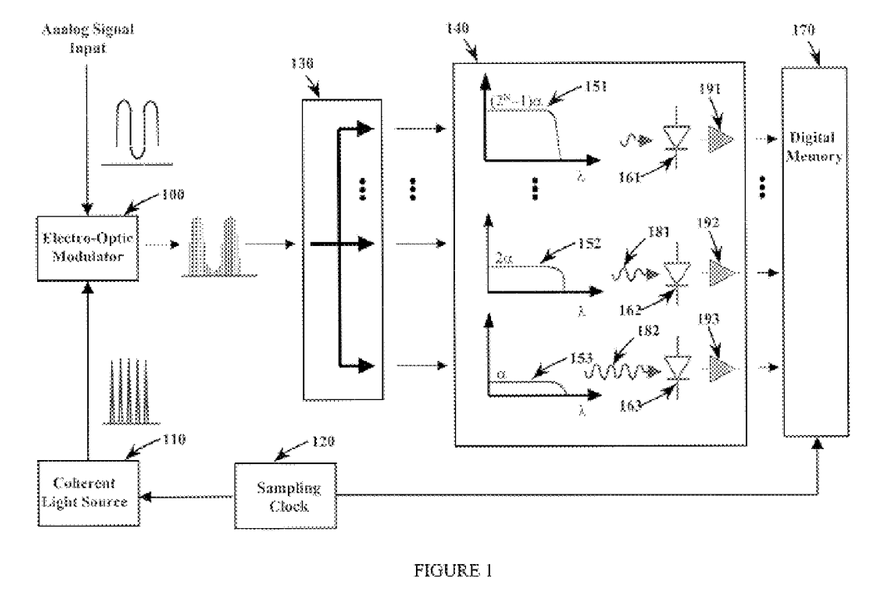
FIG. 1 is a schematic diagram representation of a 2-bit form of the present invention.

Referring to FIG. 1, a 2-bit photonic ADC of the present invention includes a coherent light source 110 (in the preferred embodiment, a mode-locked laser), an electro-optic modulator 100, a sampling clock 120, an optical splitter 130, a passive photonic quantizer 140 containing light absorbers 151, 152, and 153; optical delay lines 181 and 182; optical detectors 161, 162, and 163; comparators 191, 192, and 193; and a digital storage device 170 (in the preferred embodiment, a digital memory).

Coherent light source 110 samples the analog signal input at a clock rate provided by sampling clock 120 using electro-optic modulator 100. The output of electro-optic modulator 100 is fed into optical splitter 130. FIG. 1 shows, by a series of three dots, that a plurality of output branches from optical splitter 130 is possible. The number of outputs from optical splitter 130 in the preferred embodiment depends upon the bandwidth of the analog signal to be converted and the desired resolution (i.e., number of bits) of the digital representation. The number of light absorbers 151, 152, and 153; optical delay lines 181 and 182; optical detectors 161, 162, and 163; and comparators 191, 192, and 193 scale in number equally to the number of output branches in optical splitter 130. In turn, the number of branches in optical splitter 130 will equal to $2^N-1$, where N is the number of bits in the digital representation. In FIG. 1 the bit length N is two; it follows that there must be three output branches from optical splitter 130.

The sampled optical signal is a series of light pulses generated at the clock rate. Each pulse is modulated by the analog signal at successively different clock intervals, passes out of the optical splitter branches, and is passed on to passive photonic quantizer 140. Passive photonic quantizer 140 converts these light pulses into a digital format. Within passive photonic quantizer 140 are a number of light absorbers 151, 152, and 153; optical delay lines 181 and 182; optical detectors 161, 162, and 163; and comparators 191, 192, and 193. The number of light absorbers 151, 152, and 153; optical delay lines 181 and 182; optical detectors 161, 162, and 163; and comparators 191, 192, and 193 depends on the bandwidth of the analog signal and the digital resolution sought.

The design of passive photonic quantizer 140 is based on the absorbency of light absorbers 151, 152, and 153. The sampled and modulated optical signal travels in parallel to an array of $2^N-1$ light absorbers 151, 152, and 153 of varying absorbency. The optical properties of light absorbers 151, 152, and 153 are tailored so that their linear absorbency scales monotonically over the range of channels. Non-linear absorbency can be added by varying the material properties of the absorber to yield an absorbency that is a function of incident light intensity, i.e., a non-linear function. The absorbency is scaled from a very low value for first light absorber 153 in the array to a very high value for the $(2^N-1)^{th}$ light absorber 151 in the array.

Suppose a sampled light pulse of very low intensity, corresponding to a small voltage, is incident upon each of light absorbers 151, 152, and 153. The pulse will be absorbed by the $(2^N-1)^{th}$ light absorber 151 and by light absorbers 152 and 153 in the array. Likewise, all corresponding optical detectors 161, 162, and 163 remain "OFF". Suppose now a sampled light pulse of slightly greater intensity is incident upon light absorbers 151, 152, and 153. Since light absorber 153 has the lowest absorbency, it may pass a very weak signal. If absorber 153 does indeed pass the sampled light pulse, optical detector 163 is turned "ON". Optical detectors 161 and 162 remain "OFF", because the optical signal did not pass through corresponding light absorbers 151 and 152. The digital representation of the detected analog signal then corresponds to a bit pattern output from comparators 191, 192, and 193 that follow optical detectors 161, 162, and 163. We consider the "OFF" comparators to have a value '0' and the "ON" comparators to have a value '1'.

Similarly, suppose a signal with a slightly larger intensity, corresponding to a larger voltage, is incident upon light absorbers 151, 152, and 153. The signal is absorbed by the upper light absorbers but passed by the remaining light absorbers, turning on the corresponding comparators. A corresponding bit pattern is once again formed. Optical delay lines 181 and 182 are required to match the optical time delay through all $2^N-1$ light paths of passive photonic quantizer 140. Optical time delay through each light absorber is unique, related to the absorption property of that particular light absorber. Because the analog signal must be quantized at the same point on its waveform, optical delay must be employed to align all the sampled light signals to represent concurrent time samples of the analog signal at the moment they are clocked at the output of comparators 191, 192, and 193 and into digital memory 170. Optical delay lines 181 and 182 perform this function by providing maximum optical time delay to the light absorbers with the least absorbency and minimum optical time delay to the light absorbers with the greatest absorbency. Thus, no optical delay line need follow light absorber 151, which has the maximum absorption. Since light absorber 153 has less absorption, optical delay line 182 follows it, giving it a greater time delay.

Figure 2:
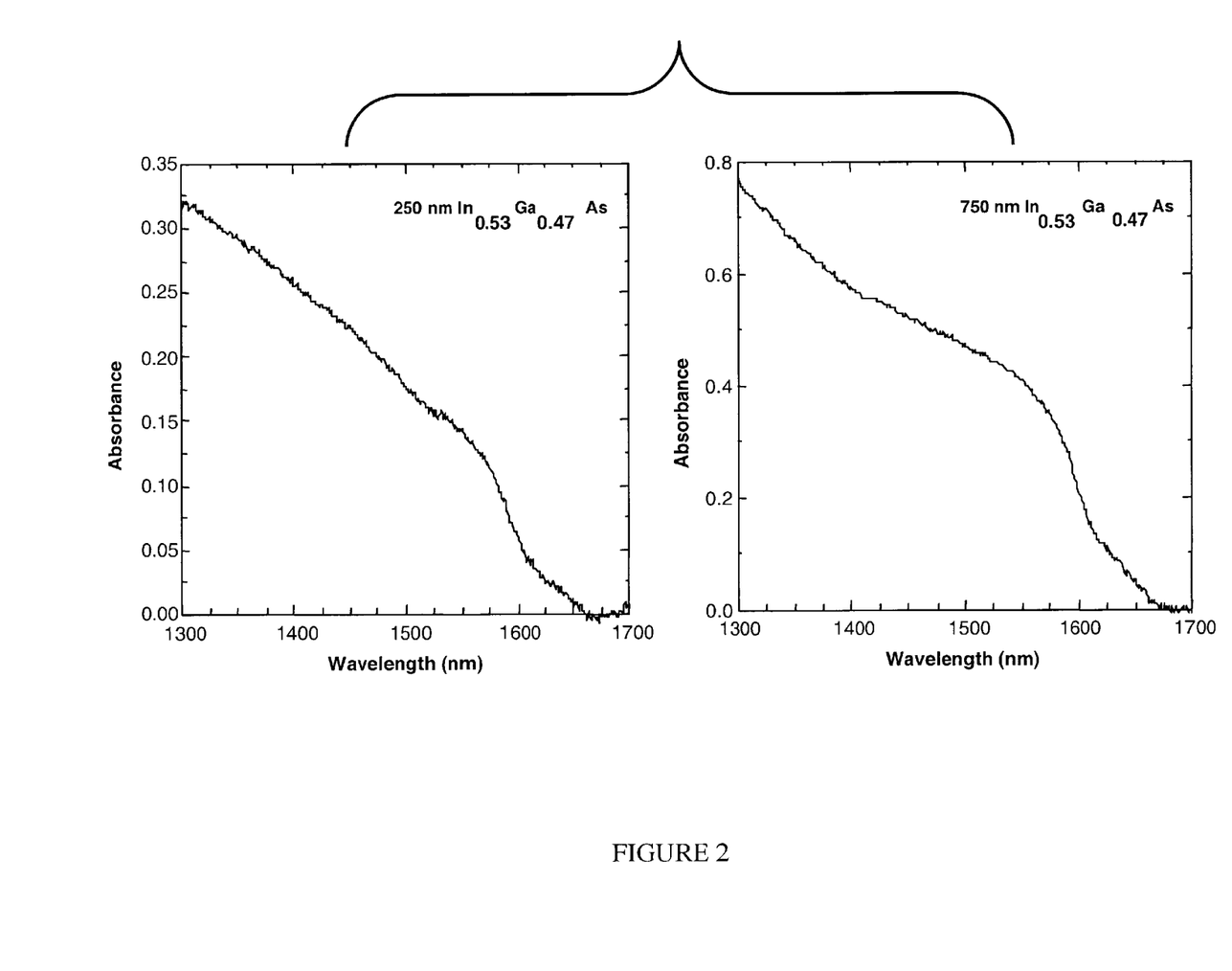
FIG. 2 plots the absorbency of the channel in the passive photonic quantizer of the present invention against the wavelength of incident light for both 250 nanometers ("nm") and 750 nm InGaAs layers grown on InP substrates.

Referring to FIG. 2, the optical properties of semiconductor InGaAs are essential to the light absorbers of passive photonic quantizer 140 of the present invention. Of particular importance are the linear absorption coefficient and the saturation intensity. InGaAs was chosen for its optical properties around 1550 nanometers (nm) wavelength. This wavelength coincides with the minimum loss transmission window of optical fiber. The bulk samples tested consisted of a 250 nm $In_{0.53}Ga_{0.47}As$ layer, on a semi-insulating InP substrate and a 750 nm $In_{0.53}Ga_{0.47}As$ layer, also on a semi-insulating InP substrate. The absorbency, $\alpha L$, of the quantum wells and is given (from Beer's law) by:

$$\alpha L = -\ln(T/T_o),$$

where T is the transmission through the multiple quantum well (MQW) sample and $T_o$ is the source transmission. The absorption coefficient $\alpha$ is found by dividing the absorbency by the total thickness L of the InGaAs layer. The absorbency spectra of the two light absorber samples, absorbency versus wavelength, are plotted in FIG. 2.

The linear absorbency spectra of the 250 nm and the 750 nm samples are similar in shape. From the graphs, the absorption coefficient of the 250 nm sample is 5880/cm; of the 750 nm sample, 5506/cm. These values compare well with previously published values of 6800/cm and 6000/cm. The absorption spectra were taken at multiple spots on each sample to verify the results.

Figure 3:
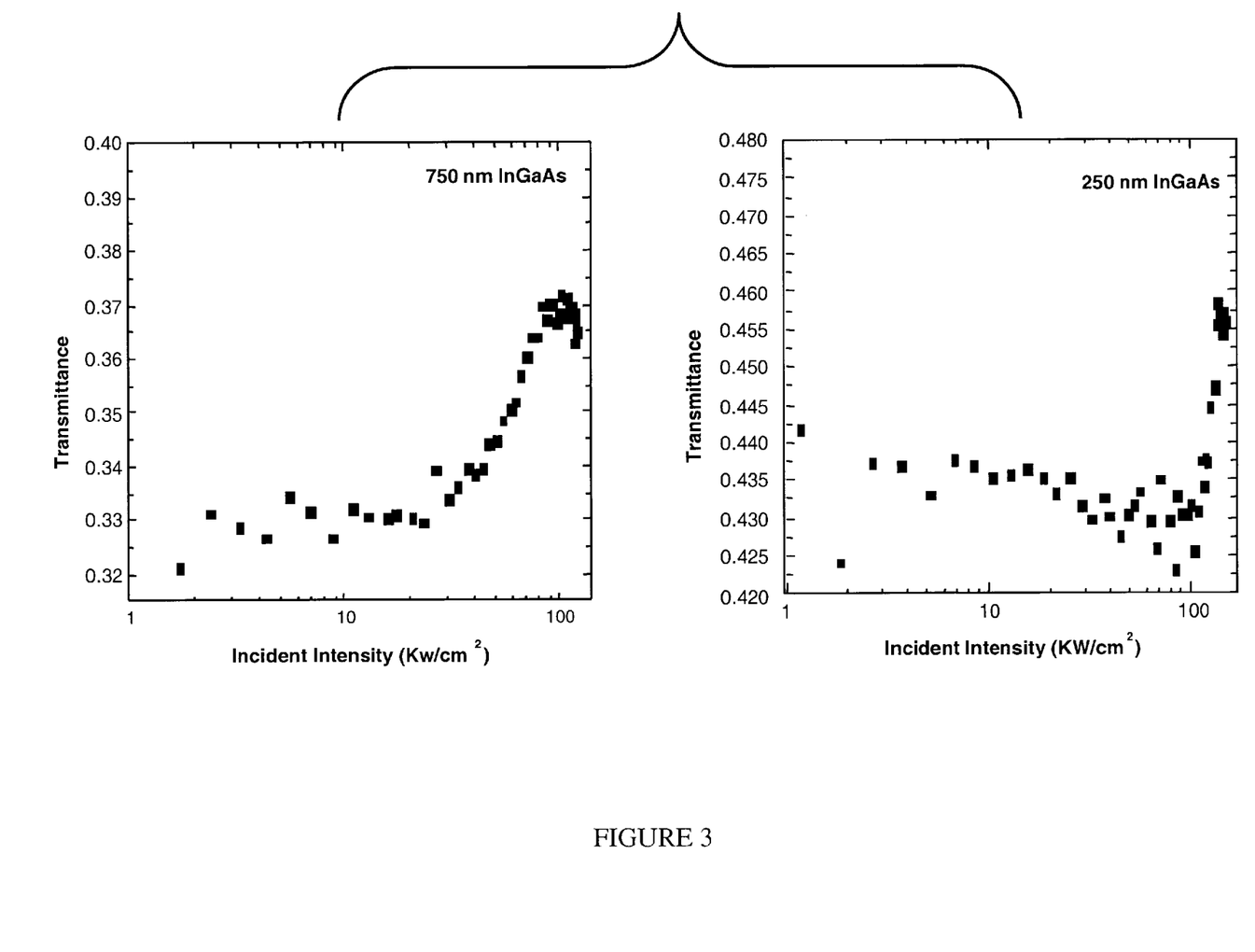
FIG. 3 plots the transmittance of the absorber in the passive photonic quantizer of the present invention against the intensity of incident light for both 250 nm and 750 nm InGaAs layers grown on InP substrates.

Referring to FIG. 3, the nonlinear absorbency (or saturation intensity) of the two InGaAs samples is critical. The architecture of the present invention operates in both the linear and non-linear absorbency regions of InGaAs.

FIG. 3 shows transmission through the samples as a function of incident intensity. The saturation intensity, $I_{sat}$ is related to intensity dependent absorption as:

$$\alpha(I_{in}) = \frac{\alpha_o}{1 + \frac{I_{in}}{I_{sat}}},$$

where $\alpha_o$ is the small signal or linear absorption coefficient and $I_{in}$ is the incident intensity. When $I_{in}=I_{sat}$, the absorption has decreased by half its linear value. However, $I_{in}$ decreases along the length of the sample because the material absorbs light. The change in intensity per unit length is a function of position within the sample, z, as:

$$I(z+\partial z)=I(z)e^{-\alpha(z)\partial z}$$

Integrating over the unit length yields:

$$\ln(I_{out}) - \ln(I_{in}) + \frac{I_{out} - I_{in}}{I_{sat}} = -\alpha_o L$$

We may solve for $I_{sat}$ from the experimental data. The saturation intensity of the 250 nm sample is approximately 100 KW/cm$^2$; of the 750 nm sample, 30 KW/cm$^2$. One might expect the saturation intensity to be much higher in the 750 nm sample, as it is three times as thick as the 250 nm sample. That the saturation intensity is lower may be attributed to strain in the 250 nm sample.

These measurements show the entire linear and non-linear regions over which the absorbers in the photonic analog-to-digital (ADC) architecture of the present invention can operate.

Figure 4:
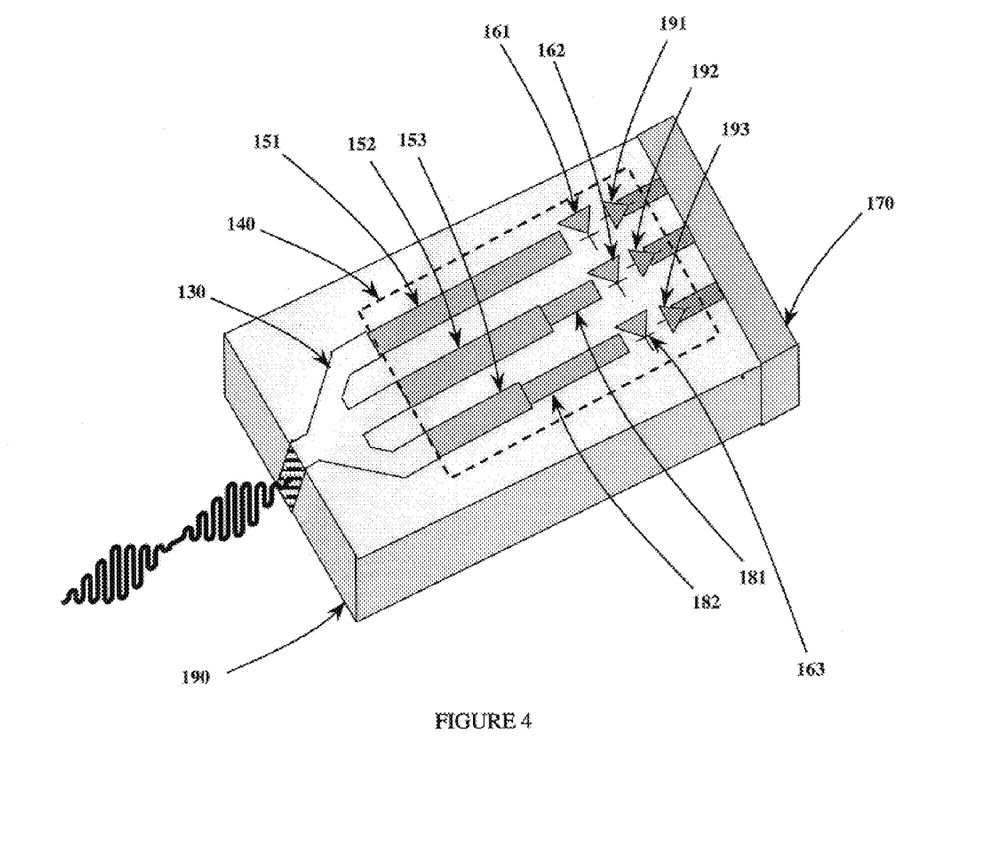
FIG. 4 is a perspective view of a 2-bit integrated passive photonic quantizer of the present invention showing a three-way optical power divider, three light absorbers, two optical delay lines, three optical detectors, three comparators and a digital memory integrated onto a single substrate.

Referring to FIG. 4, the components of the present invention may be integrated on a single substrate 190 by integrated electro-optic techniques. These components include coherent light source 110 (a mode-locked laser, not shown); electro-optic modulator 100 (not shown); optical splitter 130; passive photonic quantizer 140; and digital memory 170. Passive photonic quantizer 140 is in turn comprised of light absorbers 151, 152, and 153; optical delay lines 181 and 182; optical detectors 161, 162, and 163; and comparators 191, 192, and 193. The passive nature of this architecture makes it desirable for applications that require low power. As in electronic flash ADC systems, the total number of comparators (i.e., light absorption channels in the present invention) is $2^N-1$, where N is the number of bits of resolution. For example, a system with two bits of resolution, as depicted here, would require three light lo absorbers 151, 152, 153.

Figure 5:
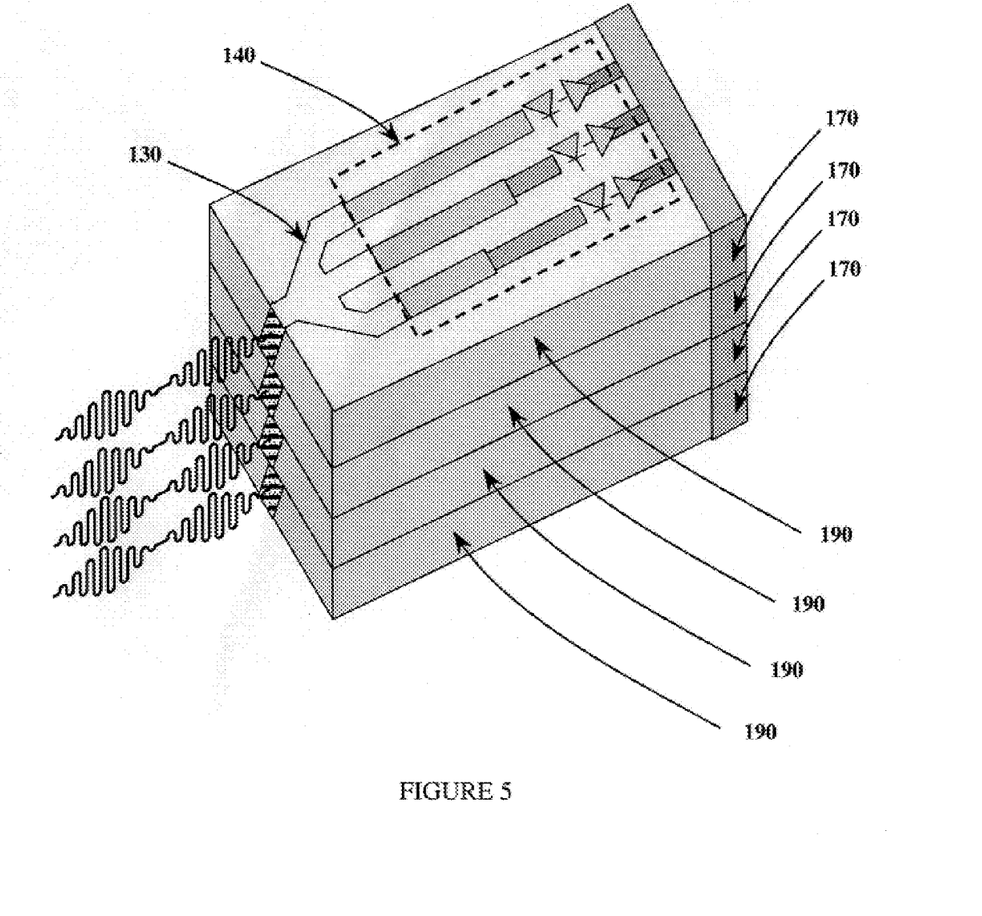
FIG. 5 is a perspective view of an array of passive photonic quantizers formed through vertical stacking.

Referring to FIG. 5, the present invention may be configured in a stack to form an array of passive photonic quantizers 140. A plurality of substrates 190 can be monolithically fabricated in layers, each layer possessing all the elements of passive photonic quantizer 140. Each layer can independently convert a stream of modulated coherent light pulses. An independent digital memory 170 is associated with each layer, clocking in a discrete digital word that corresponds to each sample of a modulated, coherent stream of light pulses. Simultaneous parallel quantization, as shown in FIG. 5, provides real-time analog-to-digital conversion of a broadband signal, which is divided into a number of signals each of narrower bandwidth and input into such an array. Alternatively, the stacked configuration shown in FIG. 5 can digitize several independent coherent streams of light pulses emanating from multiple sources.

Figure 6:
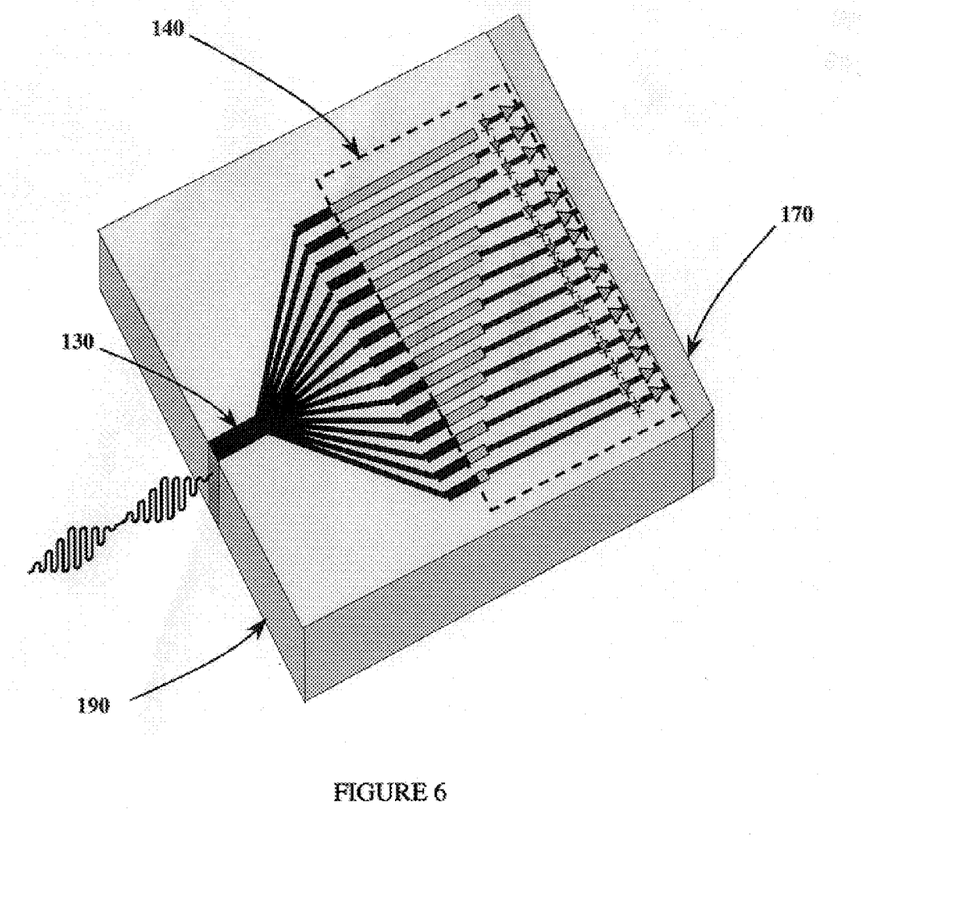
FIG. 6 depicts a 4-bit integrated passive photonic quantizer fabricated on a single substrate.

Referring to FIG. 6, large-scale planar quantization demands a high order of optical splitting, quantizing, detecting, comparing, forming digital words, and storing on a singular planar substrate 190. Such quantization is limited by the minimum detectable quantization voltage on the one hand, and the fidelity with which the optical splitter, light absorbers, and optical delay lines can be fabricated on the other. When these limitations are reached, the same resolution can be achieved by employing a stacked array of passive photonic quantizers, thereby overcoming the limits of minimum detectable voltage and fabrication.

Having described preferred embodiments of the invention with reference to the accompanying drawings, it is to be understood that the invention is not limited to those precise embodiments, and that various modifications may be effected therein by one skilled in the art without departing from the scope or spirit of the invention as defined in the appended claims.

What is claimed is:

1. A photonic analog-to-digital converter, comprising:
   a source of coherent light;
   a sampling clock, effective for converting said coherent light into a first stream of coherent light pulses;
   an electro-optic modulator, effective for receiving as inputs said first stream and an analog signal, the output of said modulator being a second stream of modulated coherent light pulses;
   an optical splitter, effective for splitting said second stream into a plurality of streams, each of said streams comprising modulated coherent light pulses;
   a passive photonic quantizer, effective for quantizing said plurality of streams, said quantizer further comprising a plurality of light absorbers;
   a plurality of optical delay lines, effective for aligning a quantized plurality of streams to a discrete instant at which each member of said plurality of streams was sampled from said analog signal;

a plurality of optical detectors, effective for converting said quantized plurality of streams into a plurality of detected voltages;

a plurality of comparators for comparing said plurality of detected voltages to a reference voltage, whereby a logical "1" is produced if said detected voltage is at least equal to a reference voltage and a logical "0" is produced if said detected voltage is less than said reference voltage; and a digital device, effective for storing a plurality of logical "1" and logical "0" as a digital word synchronous with said sampling clock.

2. The photonic analog-to-digital converter of claim 1, wherein said plurality of light absorbers further comprises:

at least one light absorption channel corresponding to an output branch of said optical splitter; and said at least one light absorption channel having a unique absorption characteristic.

3. The photonic analog-to-digital converter of claim 2, wherein said at least one light absorption channel has a variable absorbency.

4. The photonic analog-to-digital converter of claim 3, wherein said variable absorbency is induced by at least one strain mechanism selected from the group consisting of layer-to-layer mismatch, varied layer composition, varied layer growth rate, varied layer growth temperature, and varied amounts of multiple quantum wells and bulk semiconductor material.

5. The photonic analog-to-digital converter of claim 2, wherein said unique absorption characteristic increases linearly for each successive at least one light absorption channel, beginning with a minimum absorption in a first said at least one light absorption channel and increasing to a maximum absorption in a $(2^N-1)$th said at least one light absorption channel, N being a number of bits comprising said digital word.

6. The photonic analog-to-digital converter of claim 5, wherein said unique absorption characteristic increases non-linearly.

7. The photonic analog-to-digital converter of claim 1, wherein said source of coherent light, said electro-optic modulator, said optical splitter, said passive photonic quantizer, said optical delay lines, said optical detectors and said comparators are situated on a common substrate.

8. The photonic analog-to-digital converter of claim 7, wherein said passive photonic quantizer and said substrate are composed of Class III–V semiconducting materials.

9. The photonic analog-to-digital converter of claim 7, wherein said light absorbers are composed of InGaAs and said substrate is composed of InP.

10. The photonic analog-to-digital converter of claim 1, wherein said source of coherent light is a mode-locked laser.

11. The photonic analog-to-digital converter of claim 1, further comprising an array of said passive photonic quantizers for simultaneously quantizing a plurality of channels of said second stream.

12. A photonic analog-to-digital converter, comprising:

generating coherent light;

generating a clock waveform;

sampling said coherent light with said clock waveform to produce a first stream of coherent light pulses;

modulating an input analog signal onto said first stream to produce a second stream of modulated coherent light pulses;

splitting said second stream into a plurality of streams, each comprising modulated coherent light pulses;

passively quantizing said plurality of streams by absorbing said pulses in a like plurality of light absorbers;

adjusting in a predetermined fashion an absorption characteristic of each of said plurality of light absorbers;

absorbing said plurality of streams in varying degree, whereby some pulses are passed and other pulses are fully absorbed;

aligning a quantized plurality of streams to the same instant relative to the time at which they were sampled from said analog signal;

detecting each of said quantized plurality of streams, thereby producing a proportional voltage;

comparing, within the period of said clock waveform, said proportional voltage to a reference voltage, thereby producing a logical "1" if said proportional voltage is at least equal to said reference voltage and producing a logical "0" if said proportional voltage is less than said reference voltage; and storing said logical "1" and said logical "0" in a digital device.

13. The method of claim 12, further comprising the step of fabricating said source of coherent light, said electro-optic modulator, said optical splitter, said passive photonic quantizer, said optical delay lines, said optical detectors, and said comparators on a common substrate.

14. The method of claim 13, further comprising the step of fabricating said passive photonic quantizer and said substrate of Class III–V semiconducting materials.

15. The method of claim 14, further comprising the step of fabricating said plurality of light absorbers of InGaAs and said substrate of InP.

16. The method of claim 15, wherein said step of adjusting further comprises the step of inducing strain in each of said plurality of light absorbers.

17. The method of claim 16, wherein said step of inducing strain further comprises the step of introducing at least one strain-inducing mechanism selected from the group consisting of layer-to-layer mismatch, varied layer composition, varied layer growth rate, varied layer growth temperature, and varied amounts of multiple quantum wells and bulk semiconductor material.

18. The method of claim 12, wherein said step of adjusting further comprises the step of forming an absorption gradient that begins with a minimum light absorption characteristic of a first light absorber and ends with a maximum light absorption characteristic for a $(2^N-1)$th light absorber, said absorption gradient being either linear or non-linear.

19. The method of claim 12, further comprising the step of fabricating a plurality of said passive photonic quantizers so as to form an array for simultaneously quantizing a plurality of channels of said second stream.

20. A photonic analog-to-digital converter, comprising:

means for generating coherent light;

means for generating a clock waveform;

means for sampling said coherent light with said clock waveform to produce a first stream of coherent light pulses;

means for modulating an input analog signal onto said first stream to produce a second stream of modulated coherent light pulses;

means for splitting said second stream into a plurality of streams, each comprising modulated coherent light pulses;

means for passively quantizing said plurality of streams by absorbing said pulses in a like plurality of light absorbers;

means for adjusting in a predetermined fashion an absorption characteristic of each of said plurality of light absorbers;

means for absorbing said plurality of streams in varying degree, whereby some pulses are passed and other pulses are fully absorbed;

means for aligning a quantized plurality of streams to the same instant relative to the time at which they were sampled from said analog signal;

means for detecting each of said quantized plurality of streams, thereby producing a proportional voltage;

means for comparing, within the period of said clock waveform, said proportional voltage to a reference voltage, thereby producing a logical "1" if said proportional voltage is at least equal to said reference voltage and producing a logical "0" if said proportional voltage is less than said reference voltage; and means for storing said logical "1" and said logical "0" in a digital device.

* * * * *